United States Patent
Chang et al.

(10) Patent No.: US 7,446,370 B2
(45) Date of Patent: Nov. 4, 2008

(54) NON-VOLATILE MEMORY

(75) Inventors: Ko-Hsing Chang, Hsinchu (TW); Tsung-Cheng Huang, Hsinchu (TW); Yan-Hung Huang, Hsinchu County (TW)

(73) Assignee: Powerchip Semiconductor Corp., Hsinchu (TW)

( * ) Notice: Subject to any disclaimer, the term of this patent is extended or adjusted under 35 U.S.C. 154(b) by 135 days.

(21) Appl. No.: 11/308,667

(22) Filed: Apr. 20, 2006

(65) Prior Publication Data

US 2007/0262368 A1 Nov. 15, 2007

(51) Int. Cl.
*H01L 29/788* (2006.01)
(52) U.S. Cl. .................... 257/316; 257/321
(58) Field of Classification Search .......... 257/316, 257/319, 320, 321, 365, 366, E29.129
See application file for complete search history.

(56) References Cited

U.S. PATENT DOCUMENTS

| | | | |
|---|---|---|---|
| 5,793,080 A | * | 8/1998 | Hwang .................. 257/316 |
| 6,140,182 A | | 10/2000 | Chen .................... 438/259 |
| 6,291,297 B1 | | 9/2001 | Chen .................... 438/265 |
| 6,313,498 B1 | | 11/2001 | Chen .................... 257/316 |
| 6,747,310 B2 | * | 6/2004 | Fan et al. ................ 257/320 |
| 7,202,130 B2 | * | 4/2007 | Liu et al. ................ 438/261 |

* cited by examiner

*Primary Examiner*—Mark Prenty
(74) *Attorney, Agent, or Firm*—Jianq Chyun IP Office

(57) ABSTRACT

A non-volatile memory is provided, including a substrate, a control gate, a floating gate, and a select gate. A source region and a drain region are disposed in the substrate. The control gate is disposed on the substrate between the source region and the drain region. The floating gate is disposed between the control gate and the substrate. The cross-section of the floating gate presents, for example, an L-shape and the floating gate includes a central region which is perpendicular to the substrate and a lateral region which is parallel to the substrate. The central region is adjacent to the source region. The select gate is disposed on the sidewall of the control gate and the lateral region of the floating gate, and is adjacent to the drain region. Besides, the present invention further includes a method of manufacturing the above non-volatile memory.

10 Claims, 10 Drawing Sheets

NON-VOLATILE MEMORY

BACKGROUND OF THE INVENTION

1. Field of Invention

The present invention relates to a semiconductor device and a manufacturing method thereof. More particularly, the present invention relates to a non-volatile memory and a manufacturing method thereof.

2. Description of Related Art

Among various non-volatile memory products, EEPROM, having the advantages that data can be stored, read, and erased more than once and stored data will not disappear even when power is cut off, has become a memory device widely used in personal computers and electronic equipment.

A conventional EEPROM has a floating gate and a control gate, which are manufactured by doped polysilicon. In order to prevent a false determination caused by over-erasing or over-writing when the conventional EEPROM is erasing or writing, a select transistor is connected in series on one side of the floating gate and the control gate, such that programming and reading of the memory can be controlled by the transistor.

In the operation of the EEPROM, generally speaking, the greater the gate-coupling ratio (GCR) between the floating gate and the control gate, the lower the working voltage for the operation, such that the operational speed and efficiency of the memory are greatly enhanced. Since the GCR indicates the ratio of the capacitance value between the floating gate and the control gate to the total capacitance value of the memory, therefore, the increase of the equivalent capacity area between the floating gate and the control gate helps to increase the GCR.

However, along with the trend of high integrity of integrated circuits, the area occupied by each memory cell of the memory must be reduced, and then the linewidth of a device is also reduced accordingly. As such, the GCR between the floating gate and the control gate is decreased, such that the working voltage required by the non-volatile memory must be increased, which negatively affects the non-volatile memory applied in the field of portable electronic products requiring low energy consumption. Therefore, it is an important topic to manufacture a memory with high GCR in a limited chip area.

SUMMARY OF THE INVENTION

In view of the above, an object of the present invention is to provide a non-volatile memory and a manufacturing method thereof, wherein the GCR between gates is increased, the working voltage of a memory is reduced, and the operating speed of the memory is accelerated.

Another object of the present invention is to provide a non-volatile memory and a manufacturing method thereof to form a floating gate by means of self-alignment, thereby simplifying the manufacturing flow.

The non-volatile memory provided by the present invention includes a first memory cell that has a substrate, a control gate, a floating gate, and a select gate. A source region and a drain region are disposed on the substrate. The control gate is disposed on the substrate between the source region and the drain region. The floating gate, disposed between the control gate and the substrate, includes a central region which is perpendicular to the substrate and a lateral region which is parallel to the substrate, wherein the central region is adjacent to the source region. The select gate is disposed on the sidewall of the control gate and the lateral region of the floating gate and is adjacent to the drain region.

In the aforementioned non-volatile memory, the cross-section of the floating gate is L-shaped. The sidewall of the lateral region of the floating gate takes the shape of, for example, a circular arc curve.

In the aforementioned non-volatile memory, a second memory cell having a same structure as the first memory cell is further included, wherein the first and second memory cells are configured mirror-symmetrically and, for example, share one source region.

In the aforementioned non-volatile memory, a tunnel dielectric layer disposed between the bottom of the floating gate and the substrate is further included. Furthermore, the non-volatile memory further includes an inter-gate dielectric layer disposed between the control gate and the substrate, and between the control gate and the floating gate.

In the aforementioned non-volatile memory, a dielectric layer is further included, which is disposed between the select gate and the substrate, between the select gate and the control gate, and between the select gate and the floating gate. Furthermore, the dielectric layer extends to the substrate of the drain region and to the control gate.

In the aforementioned non-volatile memory, the material of the floating gate is, for example, doped polysilicon. The material of the inter-gate dielectric layer is, for example, silicon oxide/silicon nitride/silicon oxide. The material of the tunnel dielectric layer is, for example, silicon oxide.

Because the aforementioned non-volatile memory employs an L-shaped floating gate to enlarge the capacity area between the floating gate and the control gate, the GCR is increased correspondingly, and thereby the working voltage required by the memory is reduced and the operational speed of the memory is accelerated.

Additionally, due to the circular arc curve of the sidewall of the lateral region of the L-shaped floating gate, it is easier to draw the charges in the floating gate to the select gate during an erasing operation, thereby accelerating the operational speed of erasing.

The present invention provides a method of manufacturing a non-volatile memory. First, a substrate is provided and a patterned mask layer is formed on the substrate. A tunnel dielectric layer and a first conductive layer are formed on the substrate. Then, the first conductive layer on the top of the mask layer is removed to form the second conductive layers disposed on the sidewall of the mask layer and the substrate. After that, the mask layer is removed and a source region is formed in the substrate between the second conductive layers. Subsequently, an inter-gate dielectric layer and a third conductive layer are formed on the substrate. The third conductive layer is patterned to cover the source region and a portion of the second conductive layer on the both sides of the source region. Then, with the third conductive layer as a self-aligned mask, a portion of the inter-gate dielectric layer and the second conductive layers are removed. Then, a dielectric layer is formed on the substrate and the exposed sidewalls of the third conductive layer and the second conductive layers. A fourth conductive layer is formed on the sidewall of the third conductive layer. Then, a drain region is formed in the substrate outside of the fourth conductive layer.

In the method of manufacturing the non-volatile memory, in the step of removing the first conductive layer on the mask layer, the cross-section of each of the patterned second conductive layers presents an L-shape and the patterned second conductive layer includes a central region which is perpendicular to the substrate and a lateral region which is parallel to the substrate, wherein the central region is adjacent to the source region.

In the method of manufacturing the non-volatile memory, the material of the second conductive layers is, for example, doped polysilicon. The method of forming the dielectric layer on the sidewall of the lateral region of the second conductive layer includes thermal oxidation.

In the method of manufacturing the non-volatile memory, after the step of the thermal oxidation, the sidewall of the lateral region of the first conductive layer takes the shape of a circular arc curve.

In the method of manufacturing the non-volatile memory, the step of patterning the third conductive layer further includes removing the third conductive layer by using the inter-gate dielectric layer as a stop layer.

In the method of manufacturing the non-volatile memory, the step of removing a portion of the inter-gate dielectric layer and the second conductive layer further includes removing a portion of the tunnel dielectric layer.

In the method for manufacturing the non-volatile memory, the method of forming the tunnel dielectric layer includes thermal oxidation.

The present invention provides another method of manufacturing the non-volatile memory. A substrate is first provided, wherein a plurality of isolation structures are formed on the substrate in arrays and a mask layer is filled in the intervals between the isolation structures. After that, a portion of the mask layer is removed and the mask layer between two adjacent rows of the isolation structures is left. A tunnel dielectric layer and a first conductive layer are formed on the substrate. Afterward, the first conductive layer on the top of the mask layer and the isolation structures is removed and second conductive layers located on the two sidewalls of the mask layer and between adjacent isolation structures are formed. After that, a portion of the isolation structures and the mask layer are removed and a source region is formed in the substrate between the second conductive layers. Subsequently, an inter-gate dielectric layer and a third conductive layer are formed on the substrate. The third conductive layer, the inter-gate dielectric layer, and the second conductive layer are patterned. After that, a dielectric layer is formed on the substrate and the exposed sidewalls of the third conductive layer and the second conductive layers. A fourth conductive layer is formed on the sidewall of the third conductive layer. Then, a drain region is formed in the substrate outside the fourth conductive layer.

In the method of manufacturing the non-volatile memory, the cross-section of each of the patterned second conductive layers presents an L-shape and the patterned second conductive layer includes a central region which is perpendicular to the substrate and a lateral region which is parallel to the substrate, wherein the central region is adjacent to the source region.

In the method of manufacturing the non-volatile memory, the method of forming the dielectric layer on the sidewall of the lateral region of the second conductive layers includes thermal oxidation.

In the method of manufacturing the non-volatile memory, after the step of the thermal oxidation, the sidewall of the lateral region takes the shape of a circular arc curve.

In the method of manufacturing the non-volatile memory, after the step of removing a portion of the isolation structures, the top surface of the isolation structures is at least lower than that of the second conductive layer.

In the method of manufacturing the non-volatile memory, the step of patterning the third conductive layer involves, for example, forming a patterned photoresist layer on the third conductive layer, removing a portion of the third conductive layer by using the patterned photoresist layer as a mask, and then removing the patterned photoresist layer.

In the method of manufacturing the non-volatile memory, the step of patterning the third conductive layer further includes removing a portion of the third conductive layer by using the inter-gate dielectric layer as a stop layer.

In the method of manufacturing the non-volatile memory, the method of patterning the second conductive layers further includes using the patterned third conductive layer as a self-aligned mask.

In the method of manufacturing the non-volatile memory, the step of patterning the inter-gate dielectric layer and the second conductive layer further includes patterning the tunnel dielectric layer.

In the method of manufacturing the non-volatile memory, the method of forming the tunnel dielectric layer includes thermal oxidation.

In the method of manufacturing the non-volatile memory provided by the present invention, the L-shaped first conductive layer, i.e., the floating gate, is formed by means of self alignment. Since a lithographic process is saved, the number of the masks used in the process is reduced, thereby simplifying the manufacturing flow and reducing the manufacturing cost. Further, due to the design of the process, the adjacent memory cells share one source region and one control gate to enhance the integrity of the device.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

DESCRIPTION OF EMBODIMENTS

Figure 1:
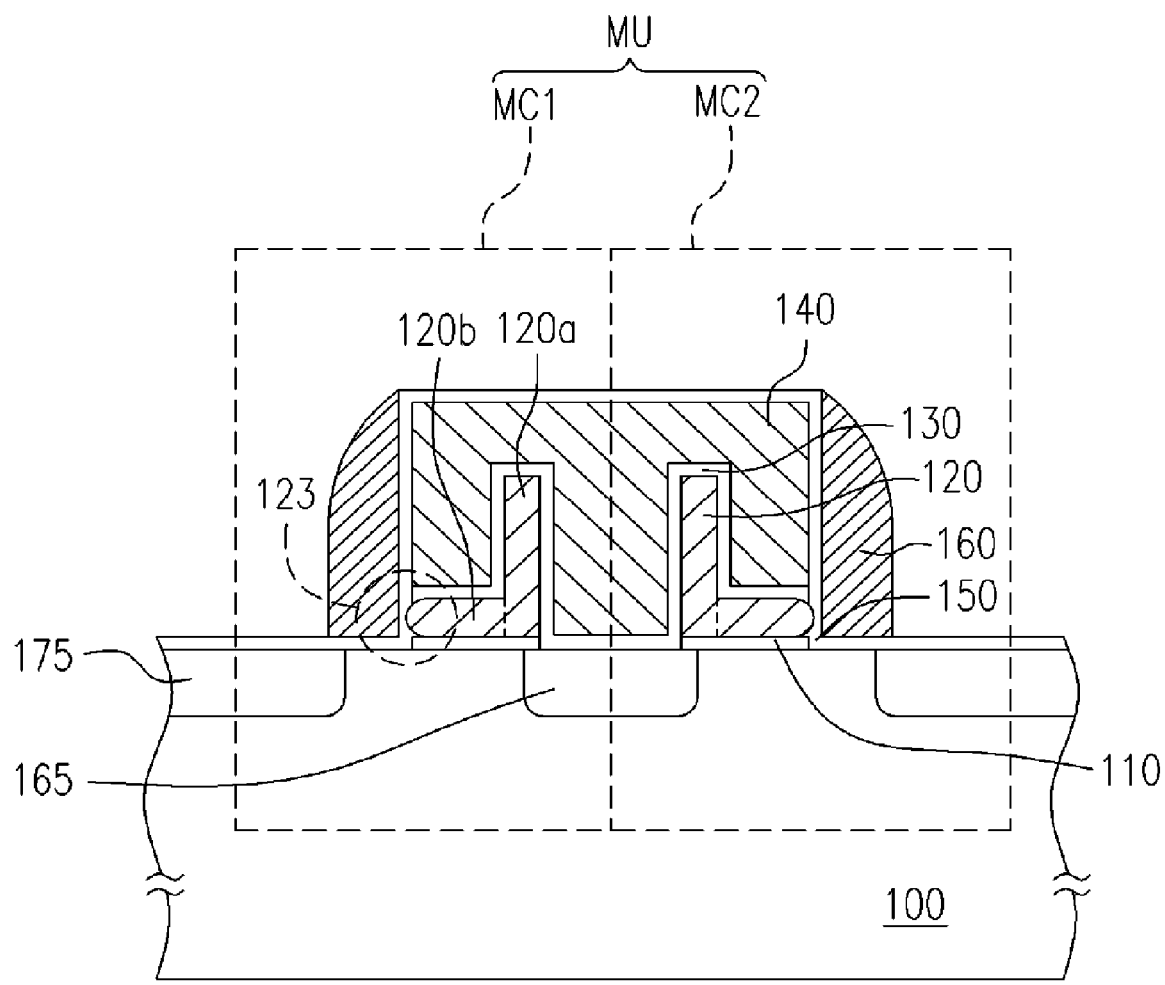
FIG. 1 is a structural sectional view of the non-volatile memory according to one embodiment of the present invention.

FIG. 1 is a structural sectional view of the non-volatile memory according to one embodiment of the present invention. Referring to FIG. 1, the non-volatile memory provided by the present invention includes, for example, a plurality of memory cells disposed on a substrate 100. Each memory cell includes a tunnel dielectric layer 110, a floating gate 120, an inter-gate dielectric layer 130, a control gate 140, a dielectric layer 150, a select gate 160, a source region 165, and a drain source 175.

The source region 165 and the drain region 175 are, for example, disposed in the substrate 100. The source region 165 is, for example, a doped region doped with P-type or N-type dopants and the drain region 175 is, for example, a doped region with the same conductive type of dopants as that of the source region 165.

The control gate 140 is, for example, disposed on the substrate 100 between the source region 165 and the drain region 175. The control gate 140 is, for example, made of conductive materials such as doped polysilicon, metals, or metal silicides.

The floating gate 120 is, for example, disposed between the control gate 140 and the substrate 100. The material of the floating gate 120 is, for example, doped polysilicon. In one embodiment, the cross-section of the floating gate 120 presents, for example, an L-shape and the L-shaped floating gate 120 includes a central region 120a which is perpendicular to the substrate 100 and the lateral region 120b which is parallel to the substrate 100, wherein the central region 120a is adjacent to the source region 165. The sidewall of the lateral region 120b of the L-shaped floating gate 120 takes the shape of, for example, a circular arc curve 123, which facilitates the erasing operation of the non-volatile memory, such that the charges in the floating gate 120 easily enter the select gate 160, thereby accelerating the operational speed of erasing.

More specifically, since the L-shaped floating gate 120 is disposed between the control gate 140 and the substrate 100, the control gate 140 is not only disposed on the lateral region 120b of the L-shaped floating gate 120, but also extends to the sidewall of the central region 120a of the floating gate 120. Since the floating gate 120 presents an L-shape, the capacity area between the control gate 140 and the floating gate 120 is also enlarged. As such, the GCR is increased correspondingly, the working voltage required by the memory is reduced, and the operating speed of the memory is accelerated.

The select gate 160 is, for example, disposed on the sidewall of the control gate 140 and the floating gate 120 and especially disposed on the sidewall of the lateral region 120b of the L-shaped floating gate 120. The material of the select gate 160 is, for example, doped polysilicon. Of course, the select gate 160 can also be made of conductive materials such as metals and metal silicides.

The tunnel dielectric layer 110 is, for example, disposed between the substrate 100 and the floating gate 120, and the material thereof is, for example, silicon oxide. The inter-gate dielectric layer 130 is, for example, disposed between the control gate 140 and the substrate 100, and between the control gate 140 and the floating gate 120. The material of the inter-gate dielectric layer 130 is, for example, silicon oxide, silicon nitride, silicon oxynitride, or a composite dielectric material such as silicon oxide/silicon nitride and silicon oxide/silicon nitride/silicon oxide.

The dielectric layer 150 is, for example, disposed between the select gate 160 and the control gate 140, the select gate 160 and the floating gate 120, and the select gate 160 and the substrate 100. The dielectric layer 150 further extends to the control gate 140 and the substrate 100 of the drain region 175. The material of the dielectric layer 150 is, for example, silicon oxide.

In the non-volatile memory provided by the present invention, for example, two memory cells having a same structure such as memory cells MC1 and MC2 in FIG. 1 are configured mirror-symmetrically to form one memory unit MU. The memory cells MC1 and MC2 share one control gate 140 and one source region 165. Due to the structure of the memory unit MU, not only is the manufacturing flow simplified and the manufacturing cost reduced, but the integrity of the device is also enhanced.

The method of manufacturing the aforementioned non-volatile memory will be illustrated below. FIGS. 2A-2F are top views of the manufacturing flow of the non-volatile memory according to one embodiment of the present invention. FIGS. 3A-3F are schematic sectional views along line a-a' in FIGS. 2A-2F, respectively. FIGS. 4A-4F are schematic sectional views along line b-b' in FIGS. 2A-2F, respectively.

Figure 2A:
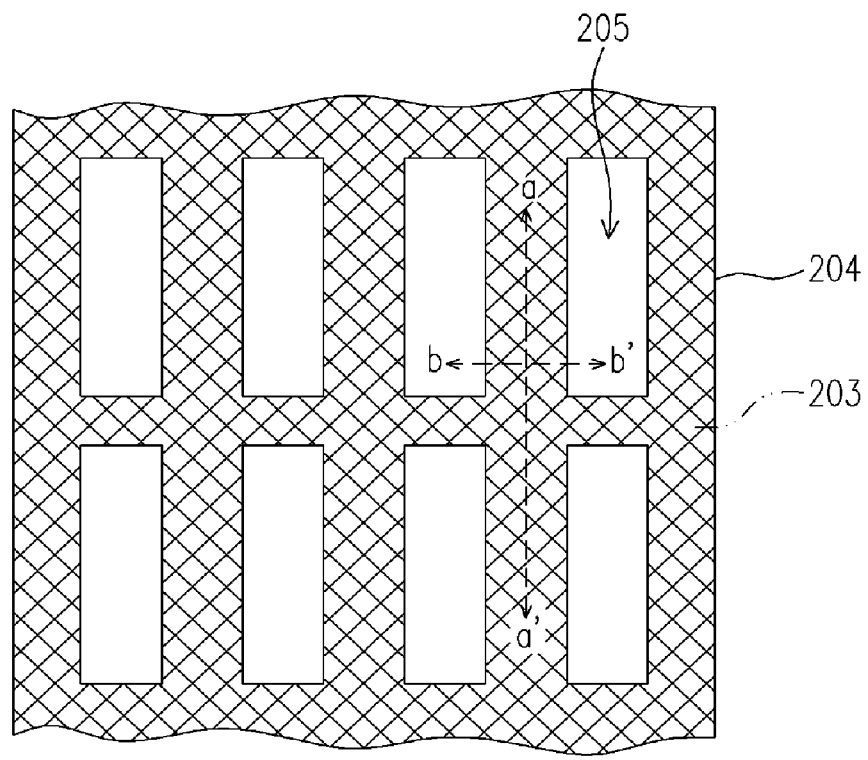
FIGS. 2A-2F are top views of the manufacturing flow of the non-volatile memory according to one embodiment of the present invention.
Figure 3A:
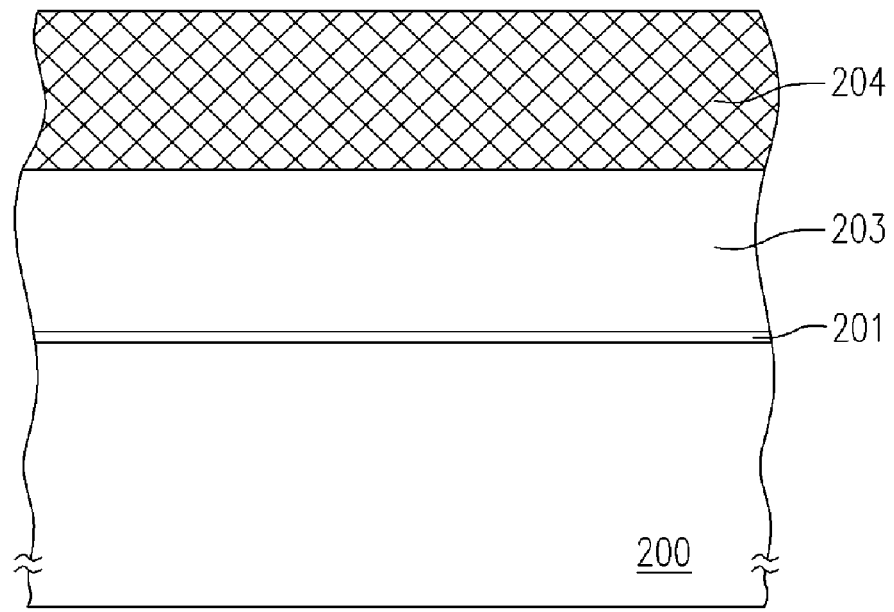
FIGS. 3A-3F are schematic sectional views along line a-a' in FIGS. 2A-2F.
Figure 4A:
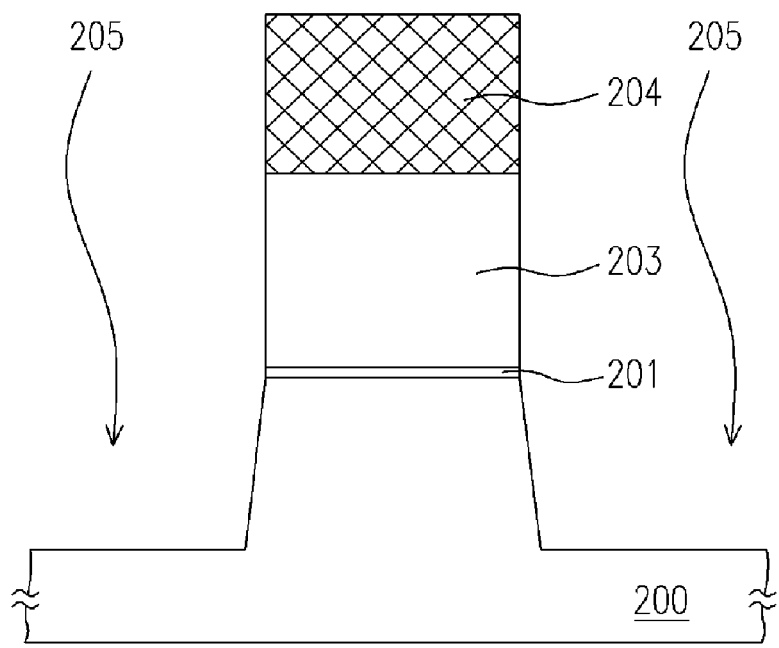
FIGS. 4A-4F are schematic sectional views along line b-b' in FIGS. 2A-2F.

Referring to FIGS. 2A, 3A, and 4A, in the method, for example, a substrate 200 is first provided; and a pad layer 201 and a mask layer 203 are formed on the substrate 200. The substrate 200 is, for example, a silicon substrate. The material of the pad layer 201 is, for example, silicon oxide, and the forming method thereof is, for example, thermal oxidation. The material of the mask layer 203 is, for example, silicon nitride, silicon carbide, or silicon oxycarbide, and the forming method thereof is, for example, chemical vapor deposition.

Subsequently, a patterned photoresist layer 204 is formed on the mask layer 203; the exposed mask layer 203, the pad layer 201, and the substrate 200 are removed by using the patterned photoresist layer 204 as a mask to form a trench 205. The method of forming the patterned photoresist layer 204 involves, for example, forming a positive photoresist layer by means of spin coating, and the pattern is developed after exposing, thus forming the patterned photoresist layer 204. The method of removing portions of the mask layer 203, the pad layer 201, and the substrate 200 is, for example, reactive-ion etching.

Figure 2B:
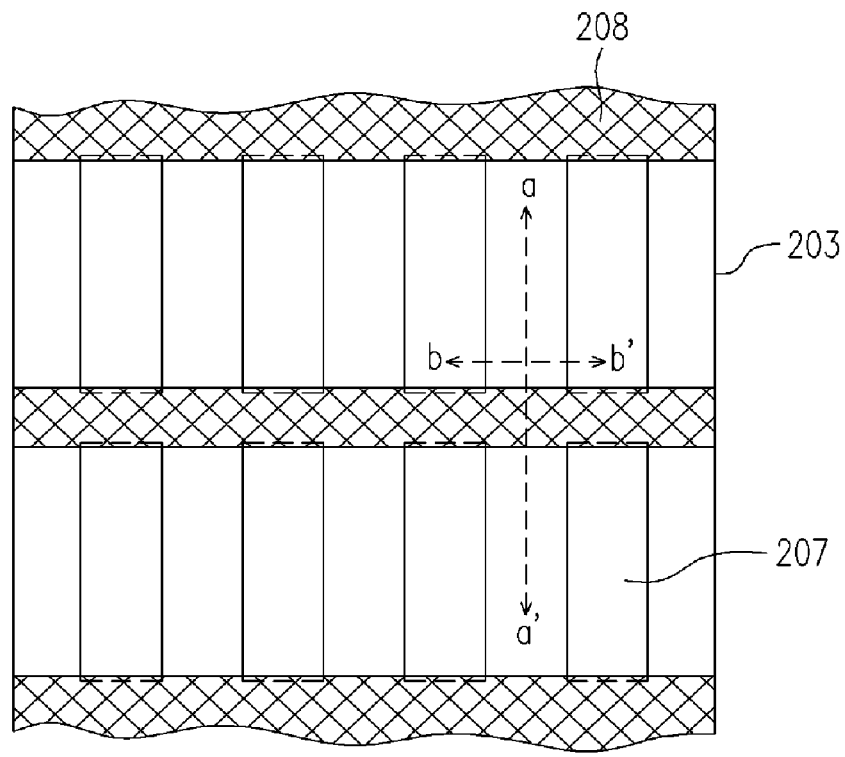
Figure 3B:
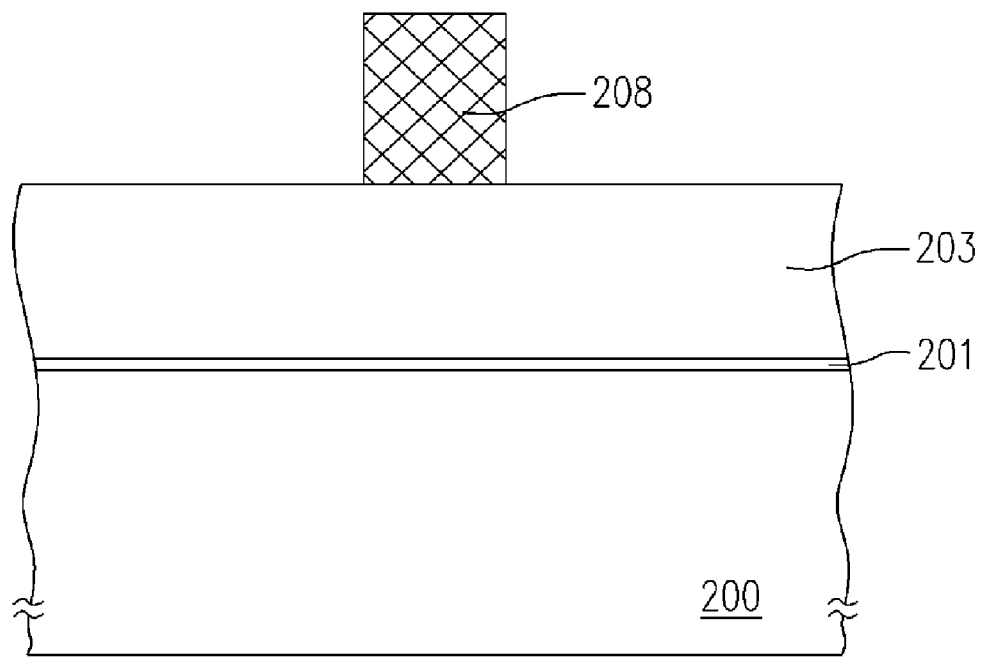
Figure 4B:
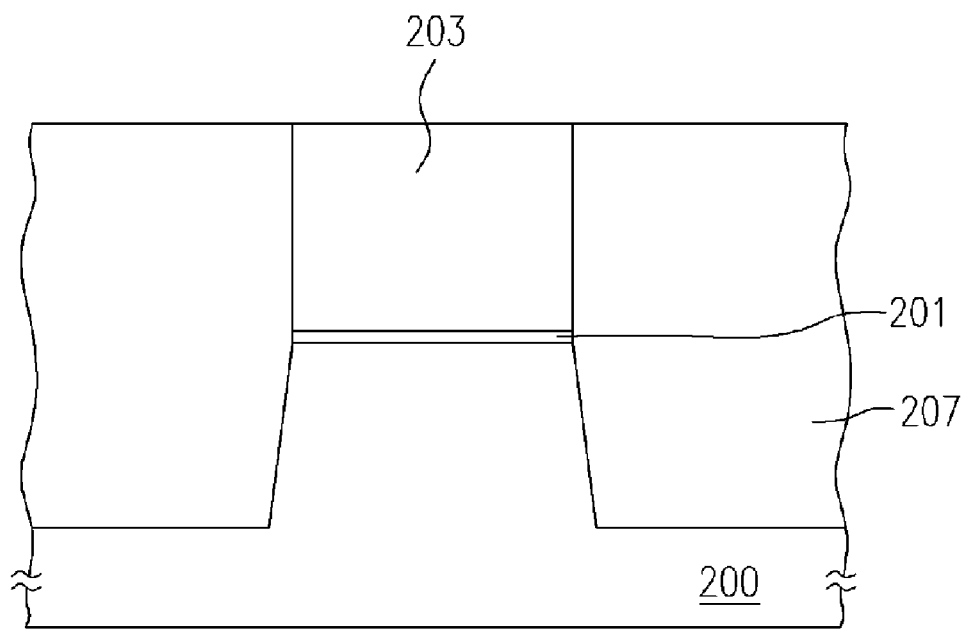

Then, referring to FIGS. 2B, 3B, and 4B, the insulating material is filled in the trench 205 to form an isolation structure 207. The method of forming the isolation structure 207 involves, for example, forming an insulating material layer such as silicon oxide. The forming method thereof is, for example, high-density plasma chemical vapor deposition. Of course, the insulating material just deposited will cover the mask layer 203, so the mask layer 203 is needed to serve as a stop layer. The insulating material is planarized to form the isolation structure 207 with a flat top surface. The planarization method the insulating material is, for example, chemical mechanical polishing.

After that, referring to FIGS. 2B, 3B, and 4B, by using another patterned photoresist layer 208, a portion of the mask layer 203 and the pad layer 201 are removed to separate the mask layer 203 and the pad layer 201 into strips. The patterned photoresist layer 208, for example, covers the mask layer 203 between two adjacent rows of the isolation structures 207. After that, by using the patterned photoresist layer 208 as a mask, the exposed mask layer 203 and the pad layer 201 thereunder are removed.

Figure 2C:
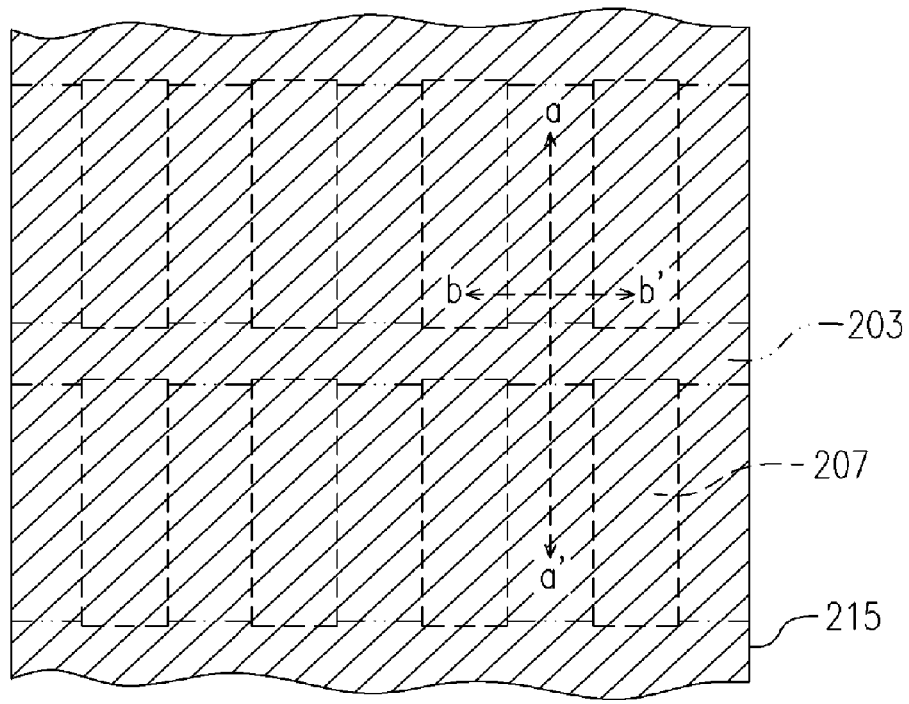
Figure 3C:
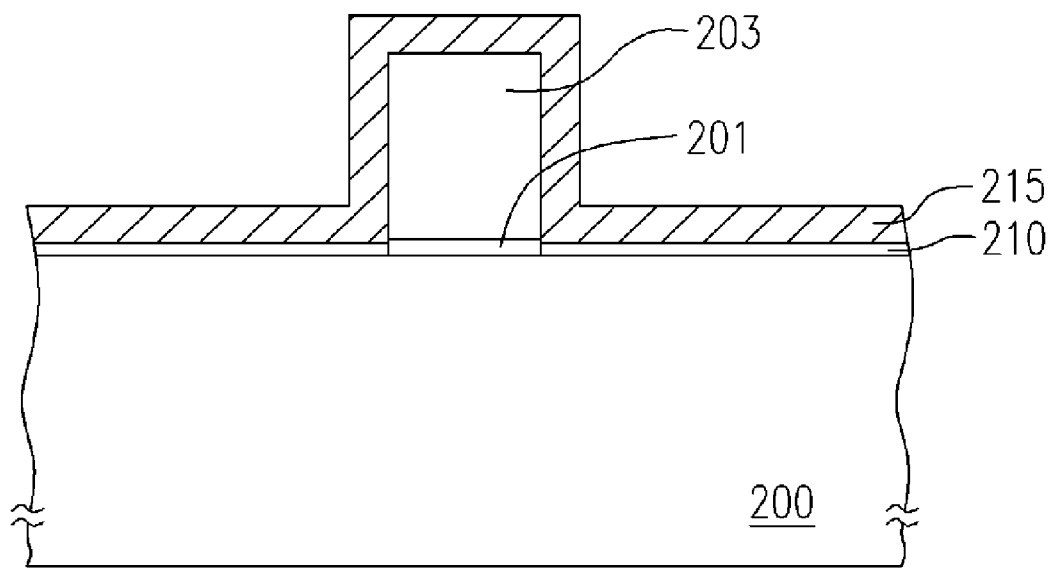
Figure 4C:
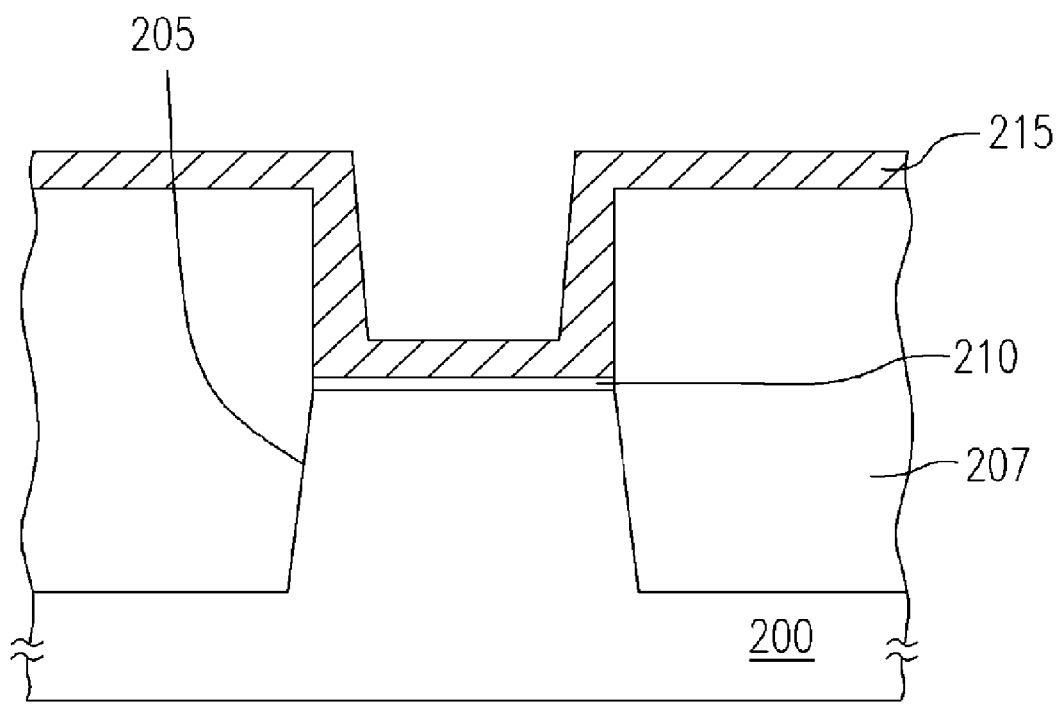

Then, referring to FIGS. 2C, 3C, and 4C, a tunnel dielectric layer 210 is formed on the substrate 200 after removing portions of the mask layer 203 and the pad layer 201. The material of the tunnel dielectric layer 210 is, for example, silicon oxide. The forming method thereof is, for example, thermal oxidation or chemical vapor deposition. Then, a thin conductive layer 215 is formed on the substrate 200. The material of the conductive layer 205 is, for example, doped polysilicon, and the forming method thereof involves forming a layer of undoped polysilicon by chemical vapor deposition, and then performing a process of ion-implantation, or adopting an in-situ implanting operation in a chemical vapor deposition process.

Figure 2D:
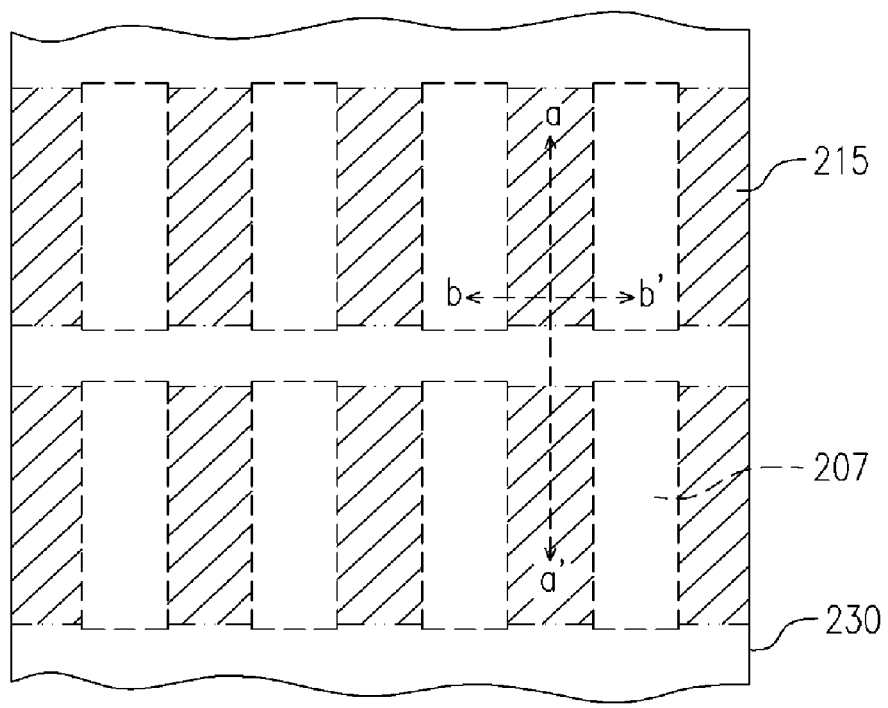
Figure 3D:
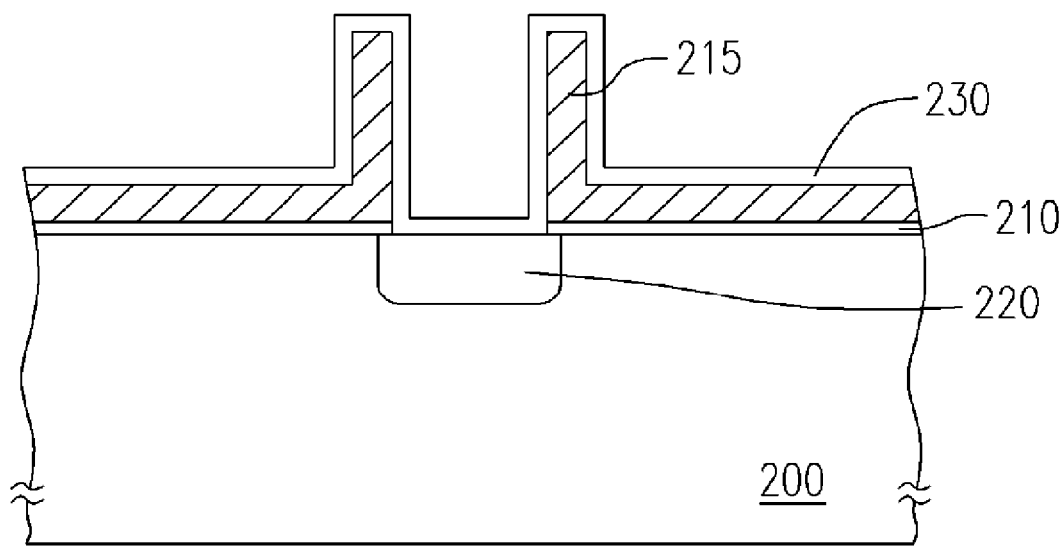
Figure 4D:
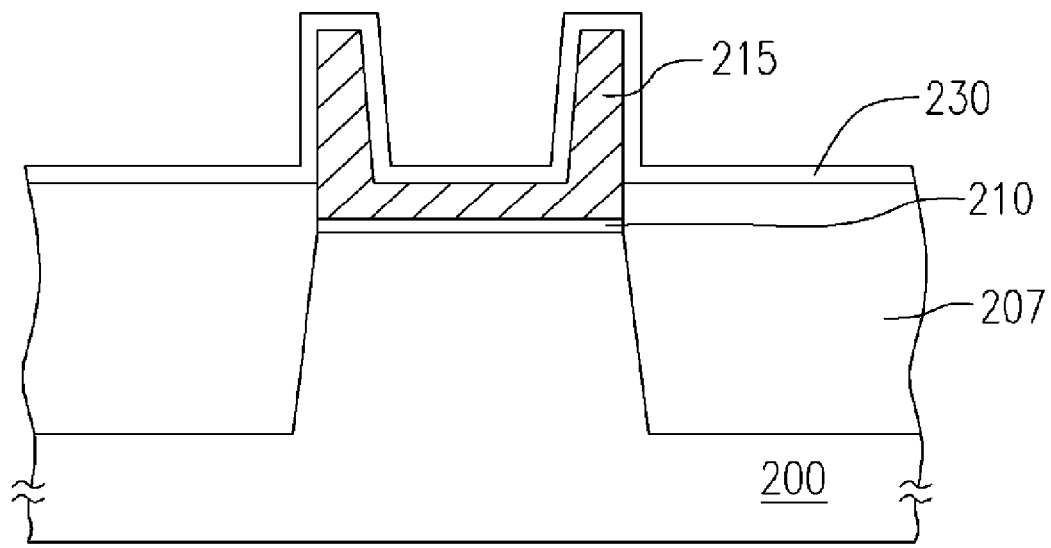

After that, referring to FIGS. 2D, 3D, and 4D, the conductive layer 215 on the top of the mask layer 203 and the isolation structure 207 is removed. The method of removing a portion of the conductive layer 215 is, for example, chemical mechanical polishing using the mask layer 203 and the isolation structure 207 as the stop layer.

Subsequently, a portion of the isolation structure 207 is removed, such that the top surface of the isolation structure 207 is lower than that of the conductive layer 215. The method of removing a portion of the isolation structure 207 is, for example, dry etching or wet etching. In one embodiment, the top surface of the isolation structure 207 is, for example, a little higher than that of the tunnel dielectric layer 210.

Then, the mask layer 203 is removed. The method of removing the mask layer 203 is, for example, dry etching or wet etching. Subsequently, an ion-implantation process is performed by using the conductive layer 215 as the mask to form the source region 220 in the substrate 200 among the conductive layer 215. The pad layer 201 is removed together with the mask layer 203, or it can be left.

Then, an inter-gate dielectric layer 230 is formed on the substrate 200. The inter-gate electric layer 230 is, for example, a silicon oxide layer, a silicon nitride layer, a silicon oxynitride layer, or a composite dielectric layer such as a silicon oxide/silicon nitride layer or a silicon oxide/silicon nitride/silicon oxide layer. The method of forming the inter-gate dielectric layer 230 is, for example, thermal oxidation, or chemical vapor deposition by using different reaction gases depending on the material of the film layer.

Figure 2E:
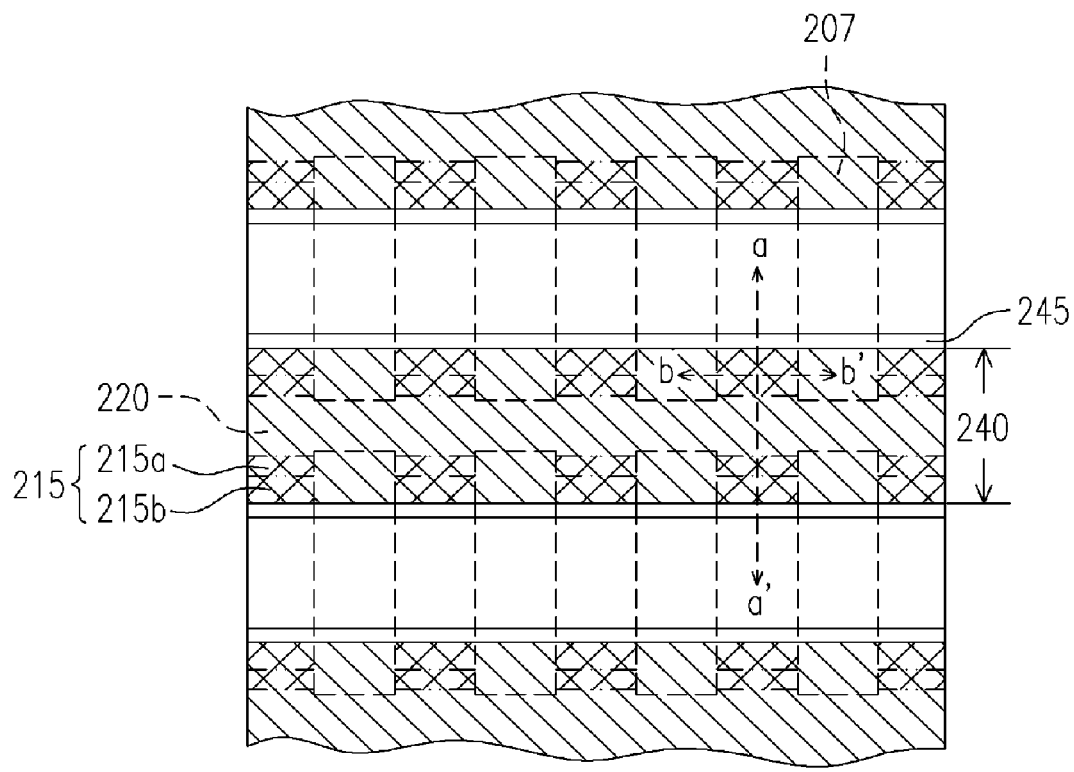
Figure 3E:
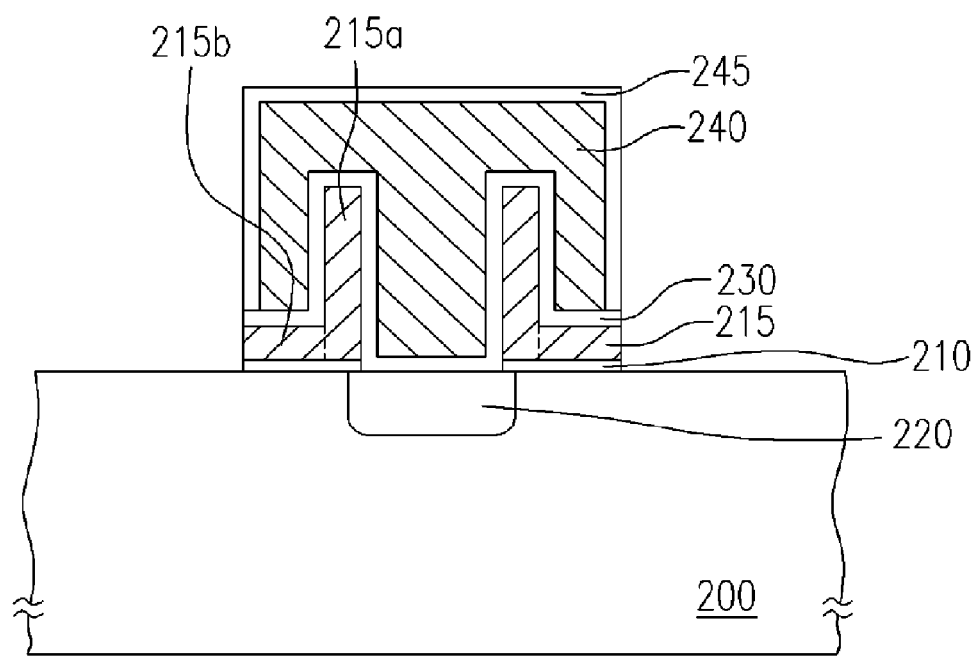
Figure 4E:
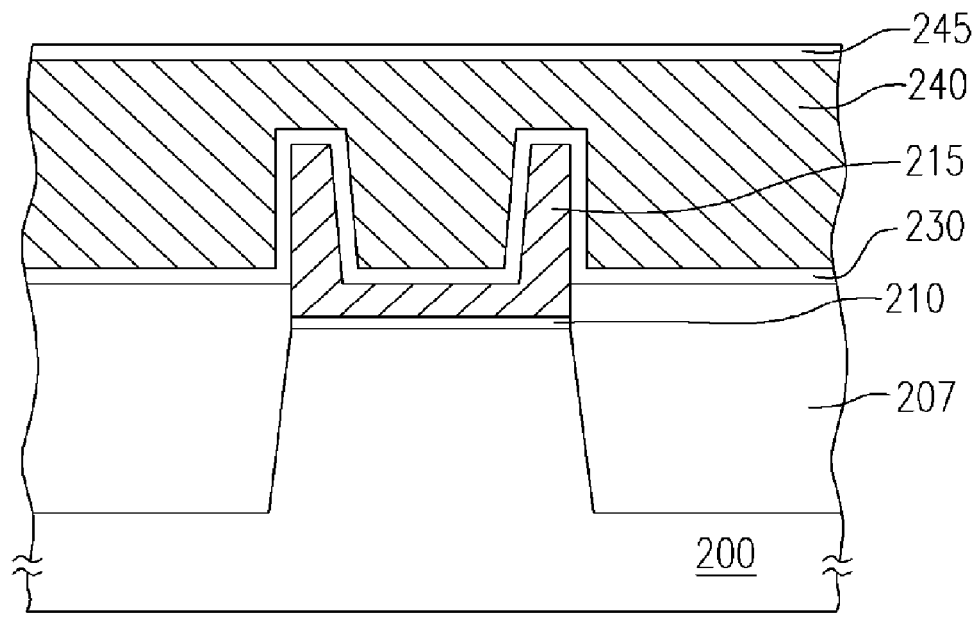

Afterward, referring to FIGS. 2E, 3E, and 4E, a conductive layer 240 is formed on the inter-gate dielectric layer 230. The material of the conductive layer 240 is, for example, doped polysilicon. The forming method thereof involves, for example, forming an undoped polysilicon layer by chemical vapor deposition and then performing an ion-implantation process, or adopting an in-situ implantation in a chemical vapor deposition process. Then, the conductive layer 240 is patterned. The method of patterning the conductive layer 240 involves, for example, forming a patterned photoresist layer (not shown) on the conductive layer 240. After that, a portion of the conductive layer 240 is removed by using the patterned photoresist layer as the mask, and then the patterned photoresist layer is further removed. A portion of the conductive layer 240 is, for example, removed by dry etching using the inter-gate dielectric layer 230 as the stop layer. The patterned conductive layer 240 is the control gate of the non-volatile memory. At this point, the conductive layer 240, i.e., the control gate, for example, covers the source region 210 and a portion of the conductive layer 215 on both sides of the source region 210.

After that, a dielectric layer 245 is formed on the exposed sidewall (including the top surface of the conductive layer 240) of the conductive layer 240 by thermal oxidation process. Then, a portion of inter-gate dielectric layer 230 and the conductive layer 215 are removed by using the conductive layer 240 as the self-aligned mask. The cross-section of the patterned conductive layer 215 is L-shaped, and includes a central region 215a which is perpendicular to the substrate 200 and the lateral region 215b which is parallel to the substrate 200, wherein the central region 215a is adjacent to the source region 220. Herein, the formed conductive layer 215 with the L-shaped cross-section is the floating gate. The method of removing a portion of the inter-gate dielectric layer 230 and the conductive layer 215 is, for example, wet etching or dry etching. The tunnel dielectric layer 210 thereunder is removed together with the inter-gate dielectric layer 230 and the conductive layer 215, or it can be removed by wet etching later.

Figure 2F:
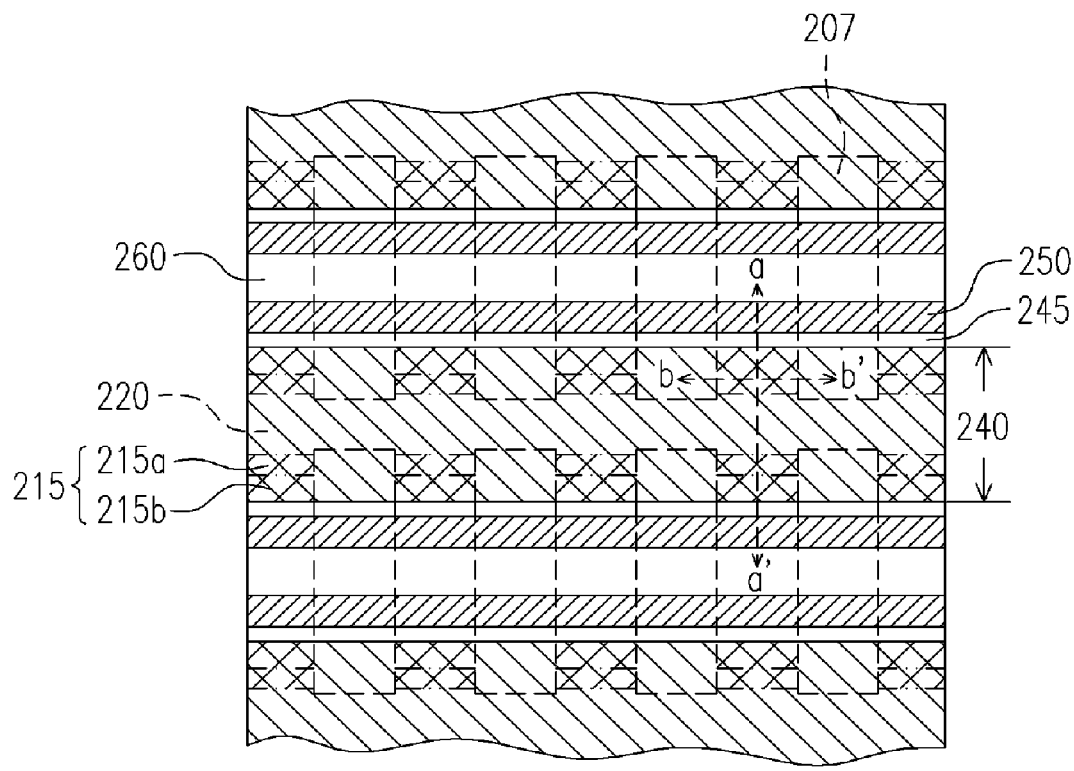
Figure 3F:
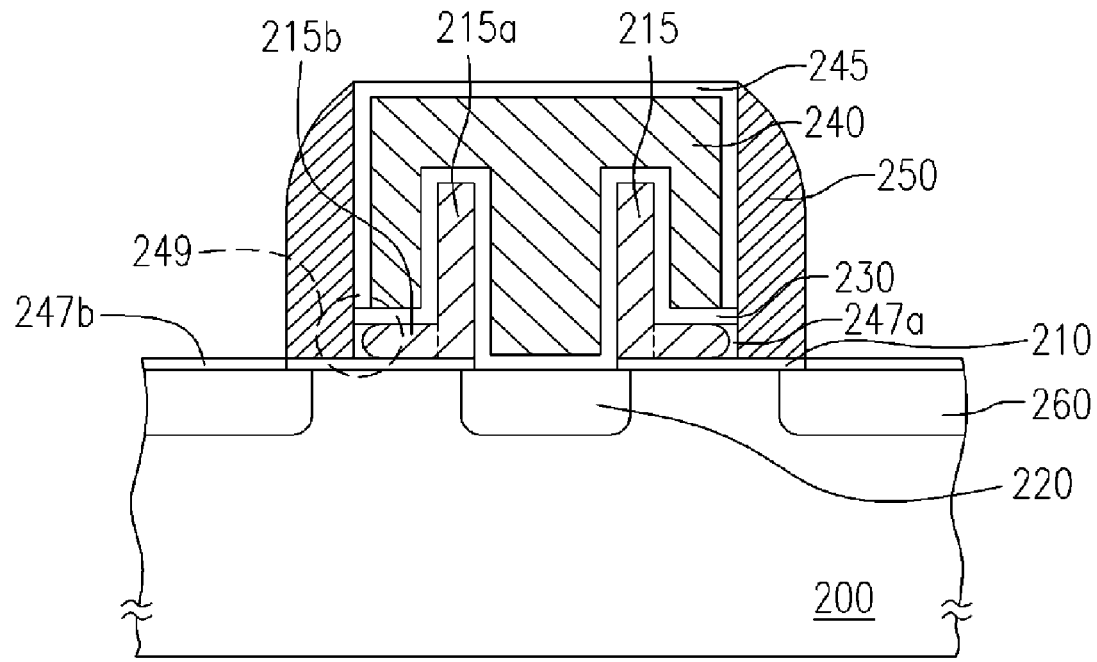
Figure 4F:
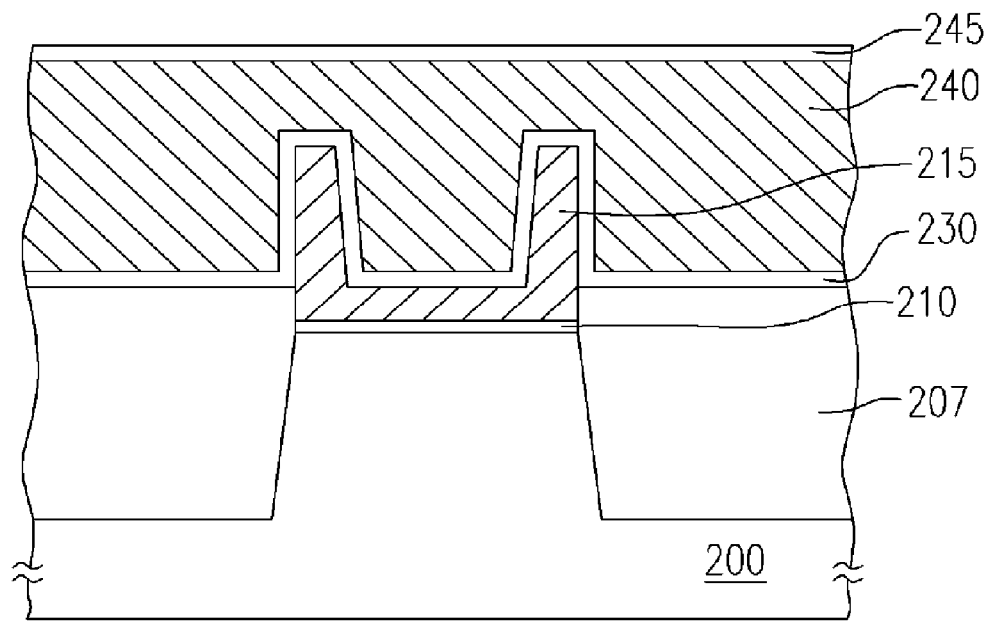

Then, referring to FIGS. 2F, 3F, and 4F, another dielectric layer 247a is formed on the sidewall, i.e., the sidewall of the lateral region 215b of the conductive layer 215, exposed by the conductive layer 215 by the thermal oxidation. After the thermal oxidation, the sidewall of the lateral region 215b of the conductive layer 215 takes the shape of a circular arc curve 249. When the thermal oxidation is performed, a dielectric layer 247b is also formed on the exposed substrate 200.

Subsequently, the conductive layer 250 is formed on the substrate 200 on both sides of the conductive layer 240. The conductive layer 250 serves as the select gate of the non-volatile memory. The method of forming the conductive layer 250 involves, for example, forming a conductive material layer (not shown) on the substrate 200. Then, an anisotropic etching process is performed to remove a portion of the conductive material layer, so as to form a conductive layer 250 on the substrate 200 on the sidewall of the conductive layer 240. The material of the conductive layer 250 is, for example, doped polysilicon. For example, the conductive layer 250 is formed by means of the ion-implantation after an undoped polysilicon layer is formed by the chemical vapor deposition or by an in-situ implantation in a chemical vapor deposition process. The conductive layer 250 serves as the select gate of the non-volatile memory.

Then, a dopant implantation process is performed by using the conductive layer 250 as the mask to form a drain region 260 in the substrate 200 outside the conductive layer 250. The drain region 260, for example, has the dopants with a same conductivity as that of the source region 220. The subsequent process of forming the non-volatile memory, for example, forming a bit line (not shown) for electrically connected to the drain region 260 or the processes of forming a protection layer and interconnects, are well known to those skilled in the art and will not be further described herein details.

In the method of manufacturing the non-volatile memory, the mask layer 203 and the isolation structure 207 are used as the stop layer. A portion of the conductive layer 215 is first removed. Further, the conductive layer 240 is used as the self-aligned mask to pattern the conductive layer 215, thereby forming the L-shaped conductive layer 215 as the floating gate of the memory, as shown in FIG. 3D.

Since the floating gate, i.e., the conductive layer 215, presents an L-shape, the equivalent capacity area between the floating gate and the control gate, i.e., the conductive layer 240 is enlarged, such that the GCR between the control gate and the floating gate is enhanced, further reducing the working voltage of the memory and accelerating the operational speed of the memory.

Besides, in the process of manufacturing the L-shaped floating gate, a lithographic process is saved, such that the number of the masks is reduced and the manufacturing flow is simplified. Due to the design of the process, two adjacent memory cells share one source region and one control gate, which helps to enhance the integrity of the device.

Furthermore, a dielectric layer 247 is formed by the thermal oxidation, and a circular arc curve 249 is formed on the sidewall of the conductive layer 215. The circular arc curve 249 helps the erasing operation of the non-volatile memory, thus making the charges in the conductor 215 (the floating gate), easily enter into the conductive layer 250 (the select gate), and accelerate the operational speed of erasing.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile memory, comprising:
a first memory cell, comprising:
a substrate having a source region and a drain region disposed therein;
a control gate disposed on the substrate between the source region and the drain region;
a floating gate disposed between the control gate and the substrate, and having a central region and a lateral region formed in an integral configuration, wherein the central region is perpendicular to the substrate and adjacent to the source region, and the lateral region is parallel to the substrate and the sidewall of the lateral region takes the shape of a circular arc curve; and a select gate disposed on the sidewall of the control gate and the lateral region of the floating gate and adjacent to the drain region.

2. The non-volatile memory as claimed in claim 1, wherein the cross-section of the floating gate is L-shaped.

3. The non-volatile memory as claimed in claim 1, further comprising a second memory cell having a structure same as the first memory cell, wherein the first memory cell and the second memory cell are configured mirror-symmetrically.

4. The non-volatile memory as claimed in claim 3, wherein the second memory cell and the first memory cell share the source region.

5. The non-volatile memory as claimed in claim 1, further comprising a tunnel dielectric layer disposed between the bottom of the floating gate and the substrate.

6. The non-volatile memory as claimed in claim 1, further comprising an inter-gate dielectric layer disposed between the control gate and the substrate, and between the control gate and the floating gate.

7. The non-volatile memory as claimed in claim 6, wherein the material of inter-gate dielectric layer comprises silicon oxide/silicon nitride/silicon oxide.

8. The non-volatile memory as claimed in claim 1, further comprising a dielectric layer disposed between the select gate and the substrate, the select gate and the control gate, and the select gate and the floating gate.

9. The non-volatile memory as claimed in claim 8, wherein the dielectric layer further extends to the substrate of the drain region and to the control gate.

10. The non-volatile memory as claimed in claim 1, wherein the material of the control gate includes doped polysilicon.

* * * * *